(12) United States Patent
Smith et al.

(10) Patent No.: US 7,150,796 B2
(45) Date of Patent: Dec. 19, 2006

(54) METHOD OF REMOVING PECVD RESIDUES OF FLUORINATED PLASMA USING IN-SITU $H_2$ PLASMA

(75) Inventors: Bradley C. Smith, Richmond, VA (US); David James, Richmond, VA (US)

(73) Assignee: Infineon Technologies Richmond, LP, Sandston, VA (US)

( * ) Notice: Subject to any disclaimer, the term of this patent is extended or adjusted under 35 U.S.C. 154(b) by 0 days.

(21) Appl. No.: 10/786,996

(22) Filed: Feb. 25, 2004

(65) Prior Publication Data

US 2004/0221869 A1 Nov. 11, 2004

Related U.S. Application Data

(62) Division of application No. 09/965,077, filed on Sep. 28, 2001, now abandoned.

(51) Int. Cl.
*B08B 7/04* (2006.01)

(52) U.S. Cl. ............... 134/18; 134/1.1; 134/22.18; 134/30; 438/905

(58) Field of Classification Search ............ 134/1, 134/1.1, 18, 26, 30, 22.1, 22.18; 438/905
See application file for complete search history.

(56) References Cited

U.S. PATENT DOCUMENTS

| | | | |
|---|---|---|---|
| 5,017,403 A | 5/1991 | Pang et al. | |
| 5,207,836 A | 5/1993 | Chang | |
| 5,486,235 A | 1/1996 | Ye et al. | |
| 5,515,986 A | 5/1996 | Turlot et al. | |
| 5,685,915 A | 11/1997 | Nimitz et al. | |
| 5,788,778 A | 8/1998 | Shang et al. | |
| 5,882,489 A | 3/1999 | Bersin et al. | |
| 5,935,340 A | * 8/1999 | Xia et al. | 134/1.1 |
| 5,976,986 A | 11/1999 | Naeem et al. | |
| 6,143,144 A | 11/2000 | Golovato et al. | |
| 6,223,755 B1 | 5/2001 | Smith, Jr. et al. | |
| 6,259,105 B1 | 7/2001 | Eddy et al. | |
| 6,350,697 B1 | 2/2002 | Richardson et al. | |

OTHER PUBLICATIONS

Smith, Bradley C., et al., "Optimizing Chamber Cleans for Better Film Deposition Performance," Journal of the Electrochemical Society, vol. 148, No. 11 (2001) pp. C721-C725.

Pearton, S.J., et al., "Dry Surface Cleaning of Plasma-Etched HEMT's," Mat. Res. Soc. Symp. Proc., vol. 282 (1993) pp. 131-138.

* cited by examiner

*Primary Examiner*—Alexander Markoff
(74) *Attorney, Agent, or Firm*—Slater & Matsil, L.L.P.

(57) ABSTRACT

In a method of affecting cleaning or chamber process control to remove residues of fluorinated discharges from internal PECVD chamber hardware during manufacture of a semiconductor or integrated circuit, the improvement of removing the fluorinated discharges without opening the chamber and without causing chamber downtime, comprising:
  a) maximizing H-atom concentration in a gas mix of a plasma containing $H_2$ through the use of high rf power and low pressure to obtain an in-situ $H_2$ plasma; and
  b) subjecting a reactor chamber containing build-up residues from previous chamber treatment with a fluorinated plasma, with the in-situ $H_2$ plasma from step a) without opening the chamber and without shutting down the chamber to remove the build-up residues of the fluorinated plasma.

1 Claim, 3 Drawing Sheets

METHOD OF REMOVING PECVD RESIDUES OF FLUORINATED PLASMA USING IN-SITU $H_2$ PLASMA

This application is a divisional of patent application Ser. No. 09/965,077, entitled "Method of Removing PECVD Residues of Fluorinated Plasma Using In-SITU $H_2$ Plasma," filed on Sep. 28, 2001, now abandoned, which application is incorporated herein by reference.

FIELD OF THE INVENTION

The present invention relates to a method of removing plasma enhanced chemical vapor deposition (PECVD) residues from a reaction chamber during a process of forming semiconductors or integrated circuits. These residues result from fluorinated discharges used to remove unwanted film deposition from PECVD chamber walls when preparing semiconductor or integrated circuits.

BACKGROUND OF THE INVENTION

It is known that manufacturing semiconductor devices on a wafer entails a number of steps, inclusive of photolithography and etching, thin film deposition, and the use of ion implantation steps alternately performed in order to develop or build-up the semiconductor device or wafer. Typically, the photolithography steps include coating a wafer with a photoresist wherein an ultraviolet photosensitive organic material is utilized. The photoresist is exposed through a mask, after which the resist is developed. Next, the exposed photoresist is etched thereby leaving given exposed areas on the surface of the wafer. Following the foregoing steps, additional processing steps such as deposition, implantation or etching may be employed on the exposed areas.

In deposition processes, particularly in PECVD processes, it is necessary to periodically remove or clean deposition material from the chamber or reactor hardware. A fluorine-based plasma discharge is commonly used to remove dielectric material such as silicon dioxide ($SiO_2$), silicon nitride ($Si_3N_4$), and silicon oxynitrides (SiON). During such fluorinated plasma cleaning, $AlF_3$ (which is a by-product of the cleaning) grows on exposed internal PECVD chamber hardware by reaction of various fluorine species with the aluminum or aluminum based chamber parts. This accumulation of $AlF_3$ on the chamber hardware alters the ensuing plasma chemistry and adversely impacts film deposition properties. In essence, the slow accumulation of $AlF_3$ causes drifting film properties and process control problems. (Refer to publication by B. Smith, et al, J. Electrochem. Soc. accepted for November 2001.)

Eventually, the $AlF_3$ must be removed in order to maintain film properties within some process window. Wet chemical cleaning is commonly used to restore PECVD chamber performance (since $AlF_3$ is water soluble). However, wet cleaning unfortunately involves removing the PECVD chamber from operation, disassembling the chamber, and cleaning the chamber parts in a wet chemical bath. This wet chemical cleaning unfortunately creates considerable chamber downtime during the wet cleaning procedure.

In the past, $H_2$ plasma etching of $AlF_3$ films on wafers has been demonstrated by S. G. Pearton, et al, Mat. Res. Soc. Symp. Aoc., Volume 282 (1993), p. 131. Pearton et al used $H_2$ plasma to remove $AlF_3$ etch-stop layers in GaAs-based wafer processing.

U.S. Pat. No. 5,882,489 disclose processes for cleaning and stripping photoresist from surfaces of semiconductor wafers. The process entails ashing the organic resist from a device, rinsing the device in water, and sputtering the rinsed device to remove residual contaminants. The stripping step is a dry etching process such as a microwave downstream process, a RIE process, or sequential or simultaneous microwave downstream and RIE process, wherein the rinsing step is performed with deionized (DI) water, and the sputtering step is performed with argon. The process is especially useful for etching via holes when the holes penetrate a conductive layer and create insoluble, inorganic contaminants such as $AlF_3$.

A method for etch rate enhancement by background oxygen control in a soft etch system is disclosed in U.S. Pat. No. 6,143,144. This sputter etch cleaning process to remove or sputter off particles from the substrate surface within the processing chamber is accomplished by:

positioning a first substrate to be processed within a processing chamber, the first substrate including a material layer containing oxygen;

introducing a process gas into the chamber;

inductively coupling electrical energy to the process gas in the chamber to form an ionized gas plasma in the chamber;

positioning a second material substrate proximate the first substrate in the processing chamber;

biasing the first and second substrates with RF electrical energy so that the plasma etches the first substrate material layer and the second substrate, the material etched from the first substrate material layer producing activated oxygen in the gas plasma;

the second substrate being formed of a material which reacts with activated oxygen to form a stable oxygen-containing compound such that material etched from the second substrate reduces activated oxygen in the gas plasma;

whereby residual oxygen in the processing chamber is reduced to maintain an etch rate for subsequent sputter etching processes.

U.S. Pat. No. 5,017,403 disclose the use of plasma-enhanced chemical vapor deposition (PECVD) to form dielectric films. The process entails:

(a) providing a substrate in a chamber;
(b) flowing a reactant gas in the chamber;
(c) generating a plasma between the electrodes by R.F. power to dissociate the gas and deposit a predetermined planarization layer of carbonaceous material on the substrate; while maintaining the substrate at a relatively low temperature wherein the layer is soft as deposited and is then hardened by thermal or plasma treatment.

A low pressure and low power $Cl_2$/HCl process for sub-micron metal etching is disclosed in U.S. Pat. No. 5,976,986. The method entails:

placing aluminum metallization coated on at least one surface with a barrier layer in an etch chamber;

creating a transformer coupled plasma from $Cl_2$, HCl, and an inert gas within the etch chamber, without a magnetic field, using separately powered electrodes positioned above and below aluminum metallizations wherein each of the electrodes are powered by less than 350 Watts, and wherein the pressure in the etch chamber is less than 15 milliTorr;

etching the aluminum metallizations with ions and radicals formed in the plasma; and adjusting a concentration of the $Cl_2$ in the plasma during the creating and etching steps between a first higher concentration during etching of the aluminum metallization and a second lower concentration during etching of the barrier layer.

The addition of hydrogen to plasma is used to reduce corrosion during the etching of aluminum layers.

In the art of PECVD processing where fluorinated plasma discharges are utilized, there is a need to remove unwanted residues from PECVD chamber hardware without wet cleaning the chamber (i.e., disassembling the chamber and cleaning the chamber parts in a wet chemical bath), which results in considerable chamber downtime.

SUMMARY OF THE INVENTION

One object of the present invention is to provide an improved method for removing PECVD chamber residues resulting from fluorinated plasma cleaning during a process for forming semiconductors or integrated circuits.

Another object of the present invention is to provide a method for removing PECVD chamber residues of $AlF_3$ or derivatives thereof that alter plasma chemistry and adversely impacts film deposition properties.

A further object of the present invention is to provide a method for removing PECVD chamber residues resulting from fluorinated plasma cleaning; namely, $AlF_3$ or its derivatives, by utilizing in-situ $H_2$ plasma or mixtures containing $H_2$, and thereby avoiding wet chemical cleaning which requires disassembling the chamber, cleaning the chamber parts in wet chemical baths, and incurring considerable chamber downtime during the wet chemical cleaning procedure.

A further object yet still of the present invention is to provide a method for removing PECVD chamber residues resulting from fluorinated plasma cleaning by using in-situ $H_2$ plasma to restore chamber performance without opening the chamber, and thereby increasing tool availability and freeing maintenance resources.

In general, the invention process of using $H_2$ plasma to etch $AlF_3$ accumulated in the reaction chamber and to improve control over film properties is accomplished after a fluorinated plasma clean by:

subjecting the reaction chamber to a mixture of $He/H_2$ at a flow rate of 1,000/200 sccm (standard cubic centimeters per minute), at about 750 W rf, at about 0.8 Torr for about 5 seconds to strike the plasma, and then cleaning the chamber by subjecting it to $H_2$ at about 500 sccm for 5–60 seconds, at about 500 W rf, at about 0.5 Torr.

BRIEF DESCRIPTION OF THE DRAWING FIGURES

DETAILED DESCRIPTION OF PREFERRED EMBODIMENT OF INVENTION

In PECVD processing, a fluorine containing discharge (here as a mixture of $CF_4+N_2O$) is introduced periodically into the chamber to remove excess deposition material (e.g., $SiO_2$ or $Si_3N_4$) in order to maintain consistent film properties from wafer to wafer. The fluorinated discharge leaves a light residue in the chamber that accumulates over successive treatments. The build-up in the chamber was identified as $AlF_x$ by EDX (energy dispersive x-ray analysis).

Figure 1:
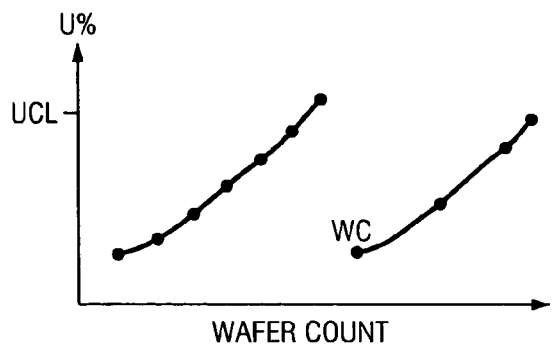
FIG. 1 is a graph showing film thickness U % versus number of wafers processed, and reflects drifting film properties in a PECVD chamber between wet cleans (denoted WC).

Accumulation of fluorine discharge residue gradually affects film deposition properties. An example of said drifting film properties in a PECVD chamber is shown in the graph of FIG. 1 which shows SiON film thickness uniformity (U %) versus the number of wafers processed. In general, all film properties including film thickness, thickness U %, n, k, and stress are subject to gradual drift depending on the sensitivity of the particular process and process parameter. Wet cleans (denoted WC in FIG. 1) are invasive procedures typically used to remove chamber residue and restore film properties. After the wet clean (WC), the SiON film thickness profile is relatively flat. With use, the profile becomes center thin and U % increases. U % is governed by the formula:

$$U\% = 100 \cdot \frac{s}{\overline{x}}$$

where s is the standard deviation of film thickness measured at nine sites on a wafer and $\overline{x}$ is the mean of the film thickness measured at the same nine sites.

Figure 2:
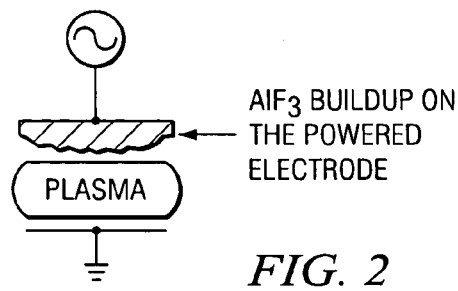
FIG. 2 depicts a reaction chamber after one or more fluorinated plasma cleans and shows $AlF_3$ build-up on the powered electrode.
Figure 3A:
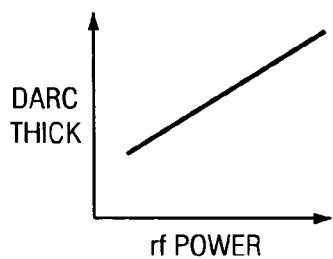
FIG. 3A is a graph generally showing SiON film thickness versus rf power (DARC is a specific SiON application), consistent with the accumulation of $AlF_3$ on a shower head to affect power coupling into plasma.
Figure 3B:
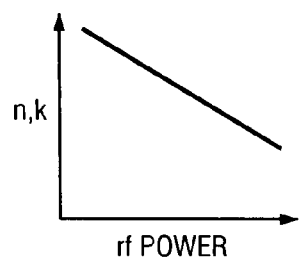
FIG. 3B is a graph generally depicting SiON optical constants refractive index (n) and extinction coefficient (k) versus rf power, which is the primary knob for adjusting plasma density. The changes that are induced by reducing power are consistent with the film drift problem.

The build-up of $AlF_3$ on the powered electrode (typically the showerhead in commercial reactors) may be seen in the parallel plate plasma reactor diagram of FIG. 2. The $AlF_3$ is a dielectric that inhibits the coupling of rf power into the plasma, resulting in reduced plasma density. An evenly distributed $AlF_3$ build-up affects the plasma chemistry which ultimately determines the properties of the film deposited. FIGS. 3A and 3B show the impact of plasma density on film properties as rf power directly modulates plasma density (i.e., higher rf power implies higher plasma density). Because the transfer of energy is affected uniformly across the chamber, film properties are impacted in a roughly uniform manner.

Figure 4A:
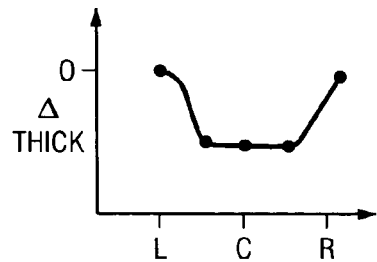
FIG. 4A is a graph depicting change in SiON film thickness by location across a wafer after processing several thousand wafers and represents the impact of non-uniform $AlF_3$ build-up (concentrated in center), and provides some indication as to why the U % drifts.
Figure 4B:
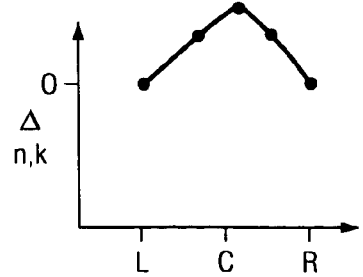
FIG. 4B is a graph showing the change in optical properties, n and k, by location across a wafer after processing several thousand wafers due to non-uniform $AlF_3$ build-up (concentrated in the center), where there is diminished plasma density in the center of the chamber.

In practice the fluorinated discharge that produces the AlF$_3$ residue may not be perfectly uniform. An uneven distribution of AlF$_3$ (or other derivatives from fluorinated plasma cleaning) on the showerhead causes an uneven transfer of power into the plasma, thereby leading to uneven plasma density across the chamber. Since plasma density plays a prominent role in the reaction chemistry, varying the plasma density locally can yield locally different film properties, as may be seen from FIGS. 4A and 4B, which shows respectively, a change in thickness versus location on a wafer and a change in n and k versus location on a wafer during the AlF$_3$ build-up. In FIG. 4A, the thickness versus position represents film properties over several thousand wafers due to non-uniform AlF$_3$ build-up (concentrated in the center), and thereby provides some indication as to why the U % drifts. In FIG. 4B, there is also shown the change in n and k versus position over several thousand wafers due to non-uniform AlF$_3$ build-up (concentrated in the center) where there is diminished plasma density in the center of the chamber.

This phenomenon is the same for oxide and nitride films, but to a slightly lesser degree.

Figure 5A:
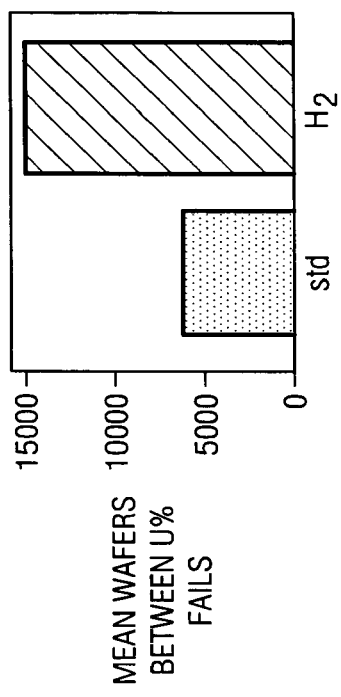
FIG. 5A is a graph comparing the number of wafers processed between wet cleans (performed as necessary to control SiON film thickness U %) for processes with and without in-situ $H_2$ plasma.
Figure 5B:
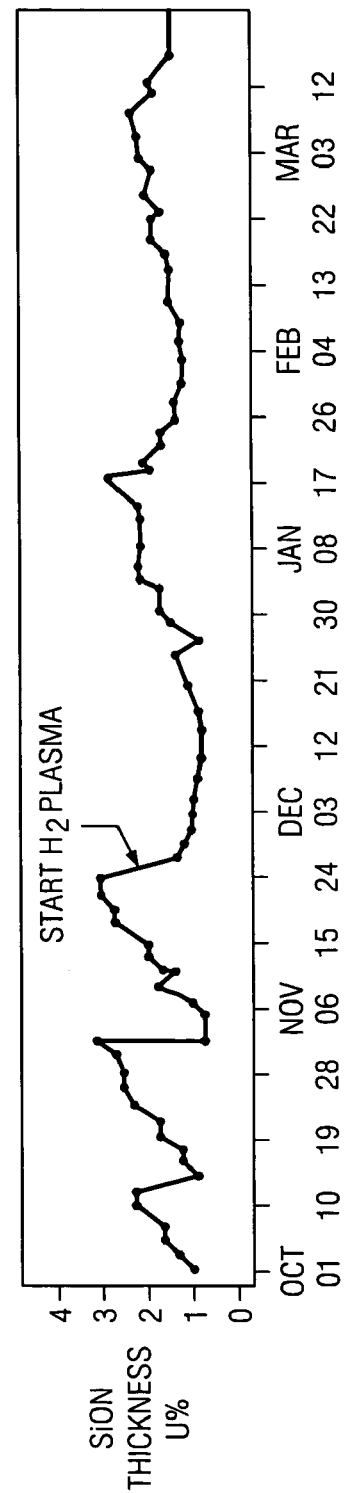
FIG. 5B is a graph showing drift in SiON thickness U %. The rate of drift is greatly reduced after introducing $H_2$ plasma to remove $AlF_3$ residues.

Wet cleaning PECVD chambers is typically performed to remove AlF$_3$ residue and restore (i.e., control) film properties. Wet cleans temporarily remove a chamber from operation and require maintenance resources for disassembling the chamber, initiating the wet chemical clean, and eventually reassembling the chamber. In large scale semiconductor manufacturing where a large number of PECVD chambers are employed, frequent chamber wet cleans can easily impact overall manufacturing productivity by reducing chamber availability and consuming maintenance resources. The invention process uses in-situ H$_2$ plasma to reduce or remove fluorinated discharge residues, namely AlF$_3$, in a less invasive manner. In essence, the invention process of removing this build-up from fluorinated plasma cleaning by using in-situ H$_2$ plasma eliminates or reduces the need for wet chemical cleaning, thereby improving chamber availability and freeing maintenance resources. The improvement realized by employing in-situ H$_2$ plasma is illustrated in FIG. 5A which compares the number of wafers processed between SiON thickness U % failures with and without H$_2$ plasma cleaning. FIG. 5B shows SiON thickness U % over time and reflects a significant reduction in U % drift rate after beginning H$_2$ plasma treatments. The invention process is the first to utilize H$_2$ plasma etching of AlF$_3$ to control chamber conditions in order to enhance control over PECVD processes and the properties of the deposited film. The invention process is the first in-situ chemical process for removal of fluorinated discharge residues. As such, the H$_2$ plasma process has distinct advantages over the wet clean process typically used in terms of chamber productivity and use of maintenance resources.

While the preferred embodiment of the invention applies the H$_2$ plasma cleaning in-situ, it should be noted that an ex-situ process would also suffice.

Figure 6:
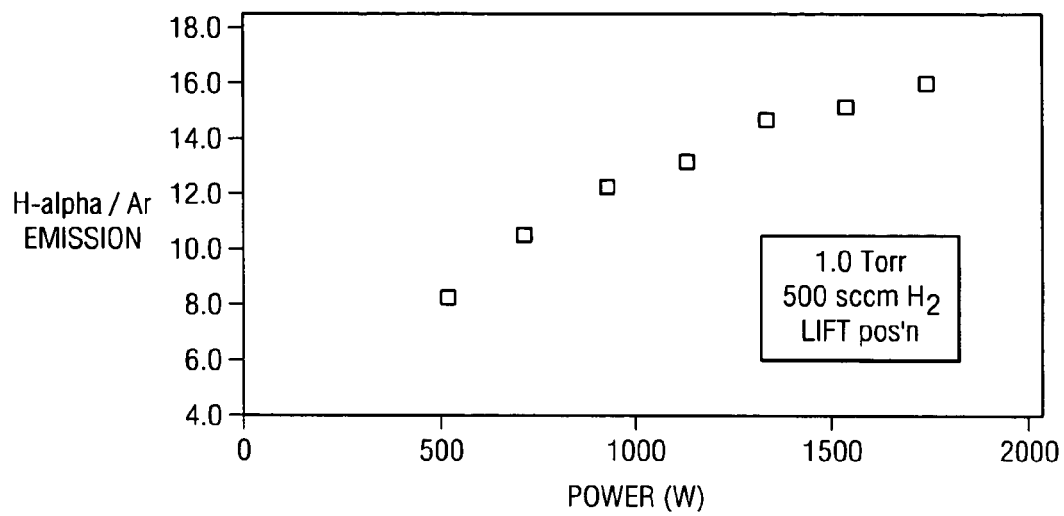
FIG. 6 is a graph generally showing the influence of rf power on H-atom concentration in a plasma as predicted by actinometry for a mixture of 99% $H_2$ and 1% Ar.

Hydrogen atoms generated in H$_2$ plasma are responsible for removal of AlF$_3$ by reduction reaction. Consequently, it is desirable to maximize the H-atom concentration (denoted [H]) for efficient removal of AlF$_3$ residues. From FIG. 6, it can be seen that the high rf power is conducive to high hydrogen atom concentration. The use of optical emission spectroscopy (OES) and actinometry, a related technique, is utilized to identify process conditions that maximize H-atom concentration in the plasma based on the relative emission from excited H and Ar atoms.

Figure 7:
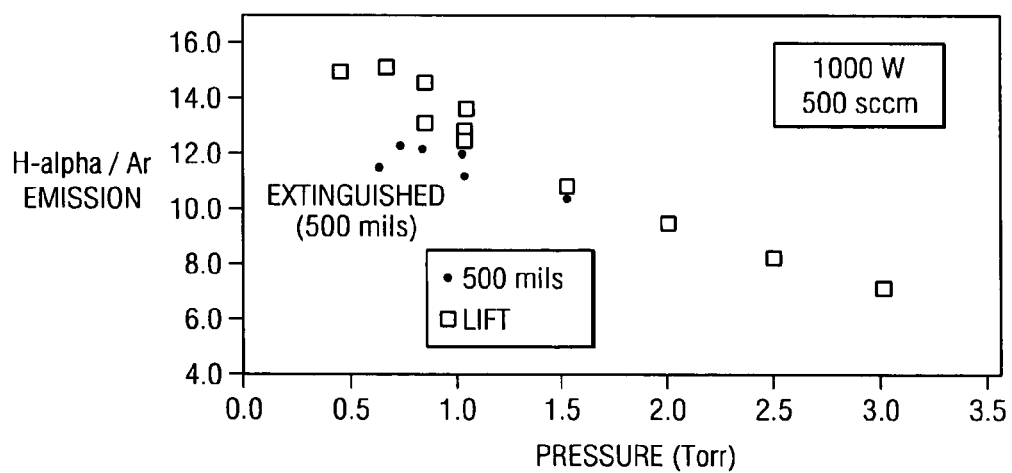
FIG. 7 is a graph generally showing the effect of pressure on H-atom concentration in a plasma as predicted by actinometry for a mixture of 99% $H_2$ and 1% Ar.

Referring to FIG. 7, it may also be seen that low pressure is also conducive to high [H]. Therefore, it is clear from FIGS. 6 and 7 that the combination of low pressure and high power are together conducive to high [H]. In general, the H-atom concentration in the plasma may be determined by the following formula:

$$\frac{\text{Intensity of H}}{\text{Intensity of Ar}} \cdot \alpha \ [\text{H atom}]$$

By use of H$_2$ plasma to etch AlF$_3$ on the faceplate of the chamber, improved control over film properties was obtained. This in-situ procedure effectively eliminates the need for wet cleans and increases tool availability. Restoration of chamber performance by removing AlF$_3$ removes AlF$_3$ growth on the chamber wall that alters PECVD chamber performance, and the invention process for removing the AlF$_3$ is superior to removal by wet chemical or mechanical means, as these means require considerable chamber downtime. Further, the in-situ H$_2$ plasma removes AlF$_3$ without opening the chamber, thereby increasing tool availability and freeing maintenance resources.

While the invention has been described in terms of its preferred embodiments, those skilled in the art will appreciate that the invention may be practiced with modifications within the spirit and scope of the appended claims.

We claim:

1. In a method of affecting cleaning to remove AlF$_3$ residue from walls of a reactor chamber, the method comprising the steps of:
   a) identifying cleaning process conditions of plasma containing H$_2$-gases that maximize H-atom concentration in said plasma of a gas mixture containing H$_2$ and Ar using optical emission spectroscopy or actinometry to identify the H atom concentration in the plasma based on the relative emission intensity from excited H and Ar atoms by the formula:

$$\frac{\text{intensity of H}}{\text{intensity of Ar}} \sim \text{H atom concentration}$$

said cleaning process conditions including one or more of flow rate, pressure, and RF power;
   b) subjecting said reactor chamber in situ to a gas mixture of He/H2 far striking a plasma then subjecting said reactor chamber in situ to H2 gas according to the cleaning process conditions identified in step a) without opening said chamber and without shutting down said chamber to affect reduction and removal of said AlF$_3$ residue.

* * * * *